United States Patent
Thorpe et al.

[11] Patent Number: 5,804,321
[45] Date of Patent: Sep. 8, 1998

[54] DIAMOND BRAZED TO A METAL

[75] Inventors: Thomas P. Thorpe, Alexandria, Va.;
Keith A. Snail, Silver Spring, Md.

[73] Assignee: The United States of America as represented by the Secretary of the Navy, Washington, D.C.

[21] Appl. No.: 99,640

[22] Filed: Jul. 30, 1993

[51] Int. Cl.$^6$ .................................................. C30B 29/04
[52] U.S. Cl. ...................... 428/623; 428/634; 428/670; 228/124.1
[58] Field of Search ............................. 228/124.1, 120, 228/903, 122.1, 203, 288, 198, 262.8; 428/623, 634, 670; 51/295; 76/DIG. 12

[56] References Cited

U.S. PATENT DOCUMENTS

| | | | |
|---|---|---|---|
| 3,702,573 | 11/1972 | Nemeth | 76/101 A |
| 3,856,480 | 12/1974 | Johnson et al. | 428/634 X |
| 3,924,031 | 12/1975 | Nicholas et al. | 427/217 |
| 3,949,263 | 4/1976 | Harper | 315/3.5 |
| 4,425,315 | 1/1984 | Tsuji et al. | 423/446 |
| 4,605,343 | 8/1986 | Hibbs, Jr. et al. | 407/119 |
| 4,845,533 | 7/1989 | Pryor et al. | 357/2 |
| 5,031,029 | 7/1991 | Acocella et al. | 357/81 |
| 5,055,424 | 10/1991 | Zeidler et al. | 437/188 |
| 5,176,720 | 1/1993 | Martell et al. | 51/293 |

*Primary Examiner*—Kurt C. Rowan
*Assistant Examiner*—Jeanne M. Elpel
*Attorney, Agent, or Firm*—Thomas E. McDonnell; George A. Kap

[57] ABSTRACT

A unitary article that is solid at a temperature in excess of about 1100° C. which includes a diamond, a metal, and a brazing material brazing the diamond and the metal. The brazing material includes a metal carbide adhering to the diamond and a platinum family metal or nickel adhering to the metal. The platinum family metal has dissolved therein carbide forming metal and contains particles of metal carbide. The article is made by depositing a platinum family metal or nickel on a metal melting above the melting point of the platinum family metal or nickel, depositing a carbide forming metal which is soluble in molten platinum family metal or nickel, heating the assembly until platinum family metal or nickel is in a molten state, and cooling the molten platinum family metal or nickel to a solid state. In another embodiment, the article of this invention is made by depositing an alloy of nickel and chromium on a metal melting above the melting point of the alloy, depositing a diamond on the alloy, heating to melt the alloy, and cooling the alloy to a solid state.

16 Claims, 1 Drawing Sheet

DIAMOND BRAZED TO A METAL

FIELD OF INVENTION

This invention pertains to the field of brazing and more particularly, to a diamond brazed to a metal.

BACKGROUND OF INVENTION

Diamond is the hardest material known. It has the highest thermal conductivity at room temperature and several of its mechanical properties, such as bulk modulus and tensile stress, are also the highest known. It has an extremely low coefficient of friction, is an excellent electrical insulator and will not corrode. Despite its many unique properties, however, diamond is not completely indestructible. It can be split or cleaved quite easily in certain directions, and will start to graphitize-oxidize at temperatures in the region of 873 K (600° C.) in air.

The known diamond-metal brazes were developed for diamond cutting tool applications where temperatures above about 700° C. were not encountered in use. Such brazing of a diamond to a metal was accomplished by placing a gold filament and a carbide forming metal between diamond and the metal heat sink and heating the assembly until gold melted and dissolved the carbide forming metal. The carbide forming metal upon being dissolved by the molten gold, reacted with diamond to form a metal carbide, thus forming a bond with diamond. The molten gold bonded to the metal.

The advent of epitaxial growth of diamond crystals on diamond substrates necessitated temperatures exceeding 700° C. Epitaxy is defined as growth of a crystal on the surface of another crystal in which the deposited crystal is oriented by the lattice structure of the substrate. Growth of diamonds by epitaxy requires a diamond substrate brazed to a metal heat sink. Since epitaxial growth of diamond crystals requires temperatures exceeding about 1100° C., it is apparent that diamond crystals cannot be brazed to a metal heat sink by means of a gold-based brazing composition since gold melts at 1064° C.

Although a certain technical article refers to single crystal diamonds of about 100–350 microns as being large crystals, for purposes herein, large single crystal diamonds are at least about 1 millimeter in size.

SUMMARY OF INVENTION

An object of this invention is a support article comprising a diamond substrate which permits the use of its diamond substrate for long term, high deposition rate, and high temperature homoepitaxial growth of diamonds on the diamond substrate.

Another object of this invention is an article of a diamond secured to a metal by means of a brazing material which can withstand temperatures exceeding about 1100° C.

Another object this invention is an article of a single crystal diamond substrate brazed to a metal heat sink with a brazing material comprising a metal carbide and a platinum family metal or nickel which composition is solid at temperatures exceeding about 1100° C.

Another object of this invention is a method for brazing a diamond to a metal heat sink by means of a brazing material which is solid at temperatures exceeding about 1100° C.

These and other objects of this invention are accomplished by brazing a diamond to a metal heat sink by means of a brazing material which is solid at temperatures exceeding about 1100° C. and which comprises a metal carbide and a platinum family metal or nickel and alloys thereof. Platinum family metals include platinum, palladium and iridium. In one embodiment, the brazing method includes the steps of providing a carbide forming metal adjacent the substrate and a platinum family metal or nickel adjacent the metal heat sink, heating the assembly of the metal heat sink and the diamond substrate separated by the brazing material to a temperature high enough to melt the platinum family metal or nickel, and cooling the brazing material to a solid state whereby the metal heat sink is secured to the diamond by means of the brazing material which remains solid at a temperature of above about 1100° C.

DETAILED DESCRIPTION OF INVENTION

Figure 1:
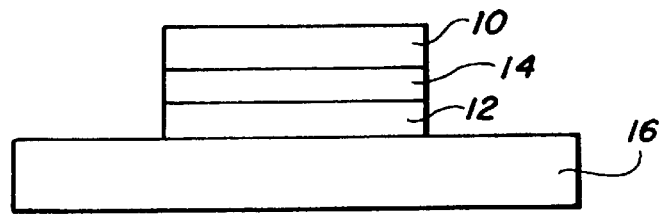
FIG. 1 is a schematic illustration of an article of this invention.

Since there is no known practical way of directly adhering a diamond to a high temperature, high thermal conductivity metal, this invention is directed to an article having a diamond secured to a metal by means of a brazing material. This invention is also directed to a method of brazing a diamond to a metal by means of the brazing material which is solid at a temperature of 1100° C. and above.

More specifically, this invention is directed to a unitary article that is solid at temperatures in excess of about 1100° C. comprising a diamond, a metal heat sink, and a brazing material securing said diamond to said heat sink, said brazing material comprising a first component bound to said diamond on one side, said first component is selected from the group consisting of metal carbides and mixtures thereof, and a second component bound to said first component on one side and to said diamond on the other side, said second component is selected from the group consisting of platinum family metals, alloys of said platinum family metals, nickel, alloys of nickel, and mixtures thereof. The method for making the article includes the steps of forming an assembly comprising, from top to bottom, a diamond, a third component, a second component, and a metal heat sink; said diamond is disposed on said third component which is selected from the group consisting of carbide forming metals and mixtures thereof; said third component is disposed on said second component which is selected from the group consisting of platinum family metals, alloys of platinum family metals, nickel, alloys of nickel, and mixtures thereof; said second component is disposed on said heat sink melting at above 1500° C.; heating said assembly to melt said second component over a period of time to prevent appreciable graphitization of said diamond; and cooling said assembly to solidify said second component.

As used herein, the term "unitary" means that the article is in one piece, i.e., that the article components are bonded together.

The article of this invention has a diamond substrate which can be polycrystalline but is preferably a single crystal diamond. Secured to the diamond by the brazing material is a metal heat sink which has the function of drawing away heat from the diamond. The platinum family metal or nickel is disposed adjacent the metal heat sink and binds with the heat sink. The metal carbide is disposed adjacent to and reacts and binds to the diamond. The metal carbide and the platinum family metal or nickel mix with and bind to each other. The various interfaces between layers are not sharp due to mixing and interdiffusion which takes place during the brazing process.

Although the diamond brazed to the metal may be referred to as the diamond substrate and the metal brazed to the diamond as the metal heat sink, it should be understood that this invention generally refers to brazing of a diamond by means of a high temperature brazing material to a high temperature, high thermal conductivity metal.

The brazing material is solid at the diamond growth temperatures for which it will be used. Suitable platinum family metals include platinum itself which melts at 1774° C., the various platinum-gold alloys which melt above 1100° C. but below 1774° C., palladium which melts at 1553° C., and iridium which melts at 2350° C. Nickel melts at 1455° C. and alloys of nickel and chromium melt at temperatures above about 1400° C. Since palladium melts at a temperature below that of platinum, but at a suitable temperature for growth of diamond, it is preferred, although platinum is also an excellent candidate. If it is desired to lower the melting temperature of the platinum family metal or nickel, another lower melting metal can be admixed therewith. This is especially applicable if platinum metal itself were to be used. Since platinum melts at 1774° C., this temperature can be reduced by admixing or alloying gold therewith which melts at 1064° C.

Suitable metal carbides include tantalum carbide which melts at 3890° C., titanium carbide which melts at 3160° C., and chromium carbide which melts at 3000° C. Tantalum carbide is generally present as the metal carbide because it has been used successfully in the past in similar applications.

The carbide forming metals react at high temperatures with the carbon of the diamond substrate to form the metal carbides. Carbide forming metals are soluble in the molten platinum family metals or nickel and particles of metal carbides are present in the solidified platinum family metals or nickel. Examples of suitable carbide forming metals are tantalum, titanium, and chromium. Tantalum melts at 2900° C., titanium melts at 1700° C. and chromium melts at 1900° C.

Instead of using a separate carbide forming metal and a separate platinum family metal or nickel to braze a diamond substrate to a heat sink, an alloy can be used which will perform the brazing function at a lower temperature than the components of the alloy. A specific example of alloys which can perform the brazing function are alloys of nickel and chromium, especially the Nichrome alloy. Nickel melts at about 1450° C., chromium melts at about 1900° C., and the Nichrome alloy melts at about 1400° C.

The heat sink is made of a metal which can withstand the high temperatures to which the article of this invention is exposed and which is wettable to the molten platinum metal or the molten nickel or a molten alloy thereof. Since single crystal diamonds can be grown at a temperature of about 1200°–1400° C., the heat sink must withstand temperatures in excess of about 1400° C., preferably temperatures in the range of 1500° C. to 3500° C. The metals that have been found to be suitable as heat sinks include, for example, molybdenum, tungsten, titanium, chromium, and niobium. If it is desired to thread the heat sink, an easily machinable material, such as molybdenum, should be used.

The metal heat sink is made of a high temperature metal which has high thermal conductivity on the order of 0.1 to 4 watts/cm-K. The metal heat sink is generally a cylinder, but can be of any other shape. The function of the heat sink is to draw heat away from the diamond substrate as quickly as possible to keep the diamond substrate cool in order to minimize graphitization of the diamond substrate.

The diamond substrate should have sufficient area to grow diamond thereon. The diamond substrate can be of any geometric shape, such as a disk, typically about 0.01–10 mm, preferably 0.05–5 mm in diameter and 0.001–20 mm, preferably 0.01–10 mm in thickness. If the substrate is of a different geometric shape, its upper surface area can vary in the range of about 0.03–30mm$^2$, preferably about 0.15–15mm$^2$.

Dimensions and character of the diamond substrate are relevant in the context of the type and size of diamond that will be grown thereon. If the diamond substrate is a single crystal of a certain size, single crystal diamond of that size can be grown thereon. If the diamond substrate is polycrystalline, diamond composed of many diamond crystals can be grown on such a substrate. The lattice structure of the grown crystal is determined by the lattice structure of the substrate.

The metal heat sink is typically effective when its thickness is 0.1 to 13 centimeters, preferably 0.2 to 5 centimeters and its diameter is 0.1 to 13 centimeters, preferably 0.2 to 5 centimeters. If the heat sink is other than a cylinder, its upper surface area can vary in the range of about 1–100 cm$^2$, preferably about 2–40cm$^2$. It is preferred that the metal heat sink have a thickness that is larger than its diameter. The exterior surface of a cylindrical metal heat sink can be threaded to facilitate its movement within a cooling block and thus control cooling thereof by moving the metal heat sink further into or out of the cooling block. Threading of the heat sink also serves the purpose of improving thermal conductivity between it and the cooling block in the embodiment where the heat sink screws into the cooling block. The contact and thereby thermal conductivity between the heat sink and the cooling block is improved by threading the heat sink and screwing it into a corresponding threaded bore in the cooling block.

The thickness of the brazing composition which is composed of a metal carbide and a platinum family metal or nickel is typically about 0.1–10,000 microns, preferably 1–1000 microns, and it should correspond in area to the diamond substrate, although it can be thicker or thinner. The metal carbide layer is generally a small proportion of the brazing composition. In terms of thickness, the metal carbide layer constitutes less than about ½ of the thickness of the brazing composition, especially about 5–30%, with remainder being the platinum family metal or nickel.

Graphitization of a diamond commences in excess of about 1400° C. in vacuum and temperatures exceeding about 1400° C. are graphitizing temperatures because conversion of diamond to graphite takes place at such temperatures. If a diamond is exposed to graphitization temperature, such exposure should be minimized to a time period of less than about 5 minutes, particularly 5 seconds to 3 minutes. In order to minimize graphitization-oxidation of diamond at very high temperatures, diamond is exposed to graphitization temperatures in a vacuum defined as a subatmospheric pressure which is a fraction of one Torr, preferably on the order of about $10^{-5}$ Torr. Generally speaking, the higher graphitization temperature dictates a shorter exposure period and vice versa for lower graphitization temperatures. Graphitization of diamond at high temperatures can also be minimized by providing an inert atmosphere around the diamond.

The article of a diamond substrate brazed to a metal heat sink can be made in many different ways. The essential aspect of the brazing method is to braze or bond or attach the diamond substrate to a metal heat sink by means of a brazing material which includes a platinum family metal or nickel and a carbide forming metal. Pursuant to a general embodiment of the brazing method, the platinum family metal or nickel is placed on the heat sink, then a carbide forming metal is placed on the platinum family metal or nickel, followed by the diamond substrate being placed on the carbide forming metal to form an assembly. This assembly includes, from top to bottom, diamond substrate, carbide forming metal, platinum family metal or nickel, and the metal heat sink. The assembly is not held together by anything but the gravity of each assembly component. The assembly is heated in a vacuum or in an inert gas atmosphere until the platinum family metal or nickel is melted. The melt dissolves the carbide forming metal, which reacts with the diamond substrate to form a metal carbide. On cooling, the brazing composition solidifies and binds the diamond substrate to the metal heat sink. The brazing material remains solid at temperatures above about 1100° C. but below graphitization temperature of diamond, particularly at about 1200°–1400° C. Preferably, the article of this invention is exposed to temperatures of at least about 75° C. below the graphitization temperature of diamond.

Amount of a carbide forming metal relative to a platinum family metal or nickel is less than 20%, preferably 5–15%, on atomic basis.

The platinum family metal or nickel and the carbide forming metal can be used in the form of foils or powder or in any other available form. If the carbide forming metal is used in the form of a powder, the powdered metal will react with the diamond substrate to form particles of the metal carbide which will form a layer of the metal carbide adjacent to the substrate. Since the carbide forming metal is soluble and dissolves in the molten platinum family metal, the carbide forming metal will be present in the solidified platinum family metal. Undissolved particles of the metal carbide may also be present in the solidified platinum family metal or nickel. If the carbide forming metal is used in the form of a metal foil, it will react with the diamond substrate to form a layer of metal carbide at the interface between the foil and the diamond substrate. This layer of the metal carbide, whether from foil or powder, is normally a few thousand angstroms in thickness and if too thick, will peel off the diamond surface. The thickness of the layer of the metal carbide should be less than about 1 micron to avoid peeling.

In one embodiment, a platinum family metal in the form of a foil is disposed over a heat sink, a foil of a carbide forming metal is disposed over the platinum family metal, and the diamond substrate is disposed over the carbide forming metal. The arrangement of the assembly from top to bottom is the diamond substrate, foil of the carbide forming metal, foil of the platinum family metal, and the metal heat sink. The assembly is placed in a vacuum or in an inert atmosphere and the heat sink is connected for resistance heating. As the heat sink is heated, it becomes very hot and begins to glow, indicating a temperature of about 700° C. Although the heat sink is red hot, the diamond substrate remains relatively cool since sufficient thermal conductivity from the heat sink to the diamond substrate has not been established. As long as the platinum family metal is not melted, insufficient thermal conductivity exists between the heat sink and the diamond substrate to enable the diamond substrate to glow. As soon as the platinum family metal is melted by the heat from the heat sink, sufficient thermal conductivity is established from the heat sink through the brazing material to the diamond substrate to make the substrate glow.

To minimize the exposure time of the diamond substrate to temperatures in excess of about 1400° C. where graphitization-oxidation of diamond commences, the assembly is cooled immediately, as by exposure to the room atmosphere, after the diamond substrate starts glowing and is removed from the oven. Cooling normally takes a couple of minutes. In this way, appreciable graphitization-oxidation of the diamond substrate is avoided. After removal of the assembly from the oven, the brazing material is solid and securely bonds the diamond substrate to the metal heat sink.

In another embodiment, a foil of a platinum family metal is disposed over the heat sink, a small amount of a carbide forming metal in powder form is sprinkled over the foil of the platinum family metal, and the diamond substrate is disposed over the powdered carbide. The heat sink is connected for resistive heating and heated until red hot. The high temperature from the heat sink causes the powdered carbide forming metal to react with the diamond substrate to form metal carbide at a temperature of about 600°–700° C. and melt the platinum family metal. Once molten, the platinum family metal dissolves the carbide forming metal.

In another embodiment of the brazing method, the carbide forming metal is deposited in a layer onto the diamond substrate to a thickness of preferably 100 to 10,000 angstroms. The carbide forming metal can be deposited onto the diamond substrate by vacuum evaporation, sputtering, plasma spraying, or any other suitable manner. Then, a powder of a platinum family metal is sprinkled onto the heat sink. The diamond substrate with the deposited layer of the high temperature, refractory carbide forming metal on one of its surfaces is disposed over the powder sprinkled surface of the heat sink. Disposition of the diamond substrate over the heat sink is made so that the platinum family metal in powder form contacts the carbide forming metal on the diamond substrate. The assembly is then heated in a vacuum until the platinum family metal is melted. On melting, the platinum family metal binds to the heat sink and to the metal carbide which is formed by the reaction of the diamond substrate and the carbide forming metal. On cooling below the melting point of the platinum family metal, the molten platinum family metal solidifies and becomes an indispensable portion of the braze which secures the diamond substrate to the heat sink. The braze composition remains solid at temperatures exceeding about 1100° C.

In another embodiment, brazing of a diamond substrate to a heat sink is accomplished with a nickel alloy, particularly Nichrome alloy, an alloy of 80% nickel and 20% chromium, on weight basis. In this embodiment, a Nichrome alloy is disposed on the heat sink, the diamond substrate is disposed on the Nichrome alloy and the entire assembly is heated to melt the alloy. Upon melting at about 1400° C., chromium in the alloy reacts with the diamond substrate to form chromium carbide which binds to the diamond substrate and the molten alloy binds to the heat sink. On cooling to a solid state, a solid bond is established between the diamond substrate and the heat sink via the alloy.

The procedure where the alloy of nickel and chromium is used is simpler than the other procedures set forth above. This procedure does not rely on the use of a platinum family metal and thus is simpler because the step of separately providing a carbide forming metal is eliminated. The chromium in the alloy forms the carbide on reaction with carbon of the diamond and the bond with the heat sink is provided by nickel and chromium. The use of the alloy is important for at least two reasons: the alloy is resistant to corrosion at high temperatures and the Nichrome alloy melts at 1400° C. whereas nickel melts at about 1450° C. and chromium melts at about 1900° C.

The article disclosed herein can be used to grow diamonds by means of an oxygen-acetylene torch on the diamond substrate. If the diamond substrate is polycrystalline, polycrystalline diamond can be grown. If the diamond substrate is a single crystal, single crystal diamond can be grown. Since single crystal diamond has superior properties to polycrystalline diamond, growth of single crystal diamonds is preferred.

Some examples of single crystal diamond properties which are superior to polycrystalline diamond properties include optical transmission, thermal conductivity, and hardness.

The type of diamond that is grown on the diamond substrate is also dependent on the temperature. Single crystal diamond, i.e., essentially graphite-free and optically transparent solid carbon, can be grown on a substrate if the substrate is a single crystal diamond and deposition temperature or temperature at time of carbon deposition on the single crystal diamond substrate is about 1200°–1400° C., particularly 1250°–1350° C. Below about 1200° C., polycrystalline diamond can be grown down to about 500° C. Above about 1400° C., crystalline graphite can be grown.

FIG. 1 illustrates an article of this invention which includes diamond substrate 10 brazed or secured to metal heat sink 16 by means of metal carbide layer 14 and platinum family metal or nickel 12. The diamond substrate is disposed on the top surface of the heat sink and is centrally located thereon. The metal carbide layer 14 is formed when carbide forming metal reacts with the diamond substrate. In molten state, the platinum family metal or nickel dissolves the carbide forming metal and on cooling to a solid state, the platinum family metal or nickel layer contains the dissolved carbide forming metal and particles of metal carbide. The various parts of the article depicted in FIG. 1 are not coextensive, as shown. Typically, the heat sink is much larger than any of the other parts of the article.

Figure 2:
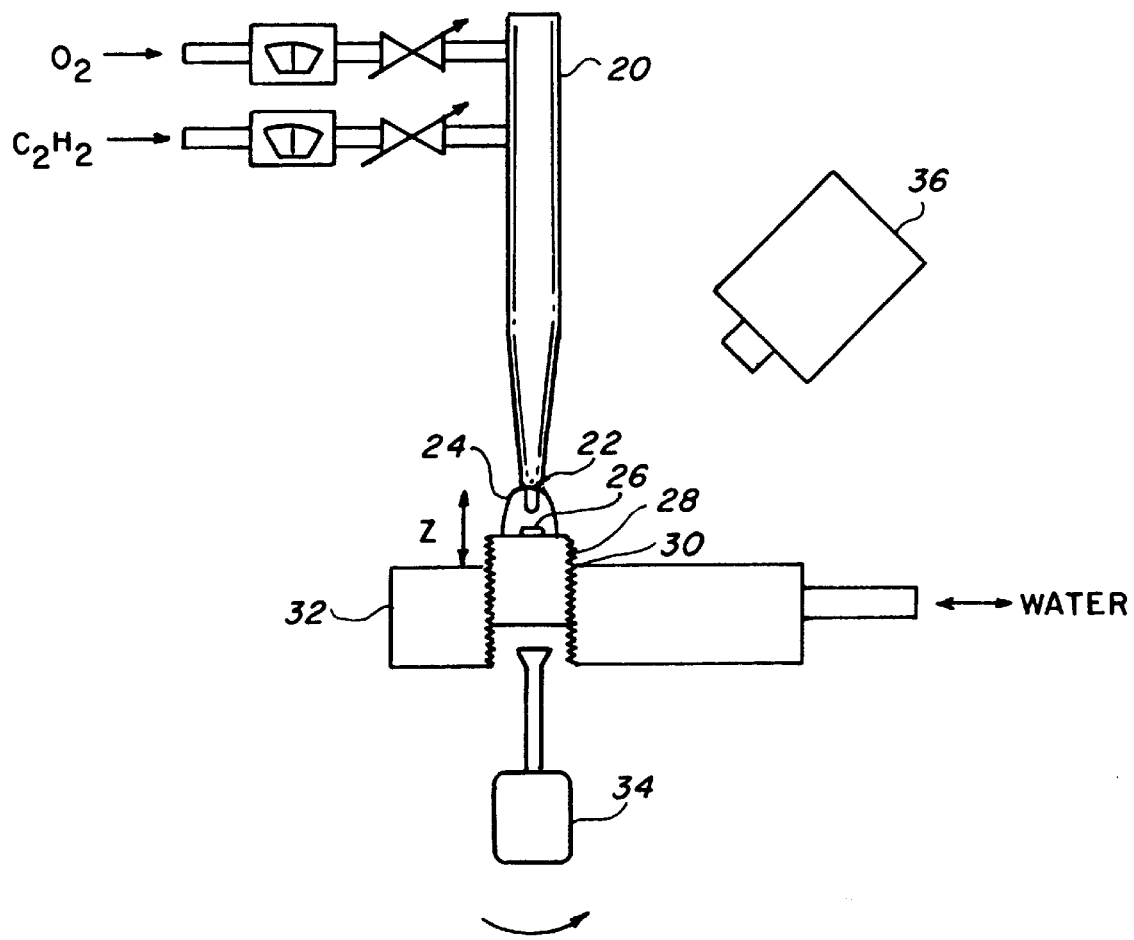
FIG. 2 is a schematic diagram of an epitaxial diamond growth using an oxygen-acetylene flame deposition apparatus.

FIG. 2 illustrates an embodiment of a suitable apparatus for long term homoepitexial growth of diamond at high deposition rate with an oxygen-acetylene torch. Long term diamond growth by the use of the oxygen-acetylene torch generally means growth of up to 24 hours at a high deposition rate of up to about 300 microns/hr at a high energy flux approaching 1 kw/cm$^2$. Oxygen gas and acetylene gas, preferably on a 1:1 volume basis, are introduced into torch 20 where they are mixed and issue from the torch through nozzle 22. By the use of the torch, it is possible to obtain rapid homoepitaxial growth because the temperature employed is high.

The mixed gases are ignited as they issue forth from nozzle 22 and form flame 24. Diamond substrate 26 is disposed on heat sink 28 which is a cylindrical solid metal plug having threaded exterior which is screwed into opening 30 in cooling block 32. Opening 30 is threaded on its interior surface so that heat sink 28 can be screwed thereinto. Screwdriver 34 can be connected to heat sink 28 and can be turned one way or the other to either raise or lower heat sink 28 within cooling block 32. The cooling block, generally made of copper, has passages therein (not shown) through which cooling medium, such as water, is circulated. Patent application entitled "Substrate Temperature Control Apparatus And Technique For CVD Reactors" bearing application Ser. No. 08/062,889 was filed on May 18, 1993, on behalf of inventors Snail and Thorpe, discloses a cooling block that can be used herein. Pyrometer 36 is used to monitor temperature of the flame, diamond substrate, deposited carbon, or temperature of any other aspect of the carbon deposition. Diamond growth is facilitated by training torch 20 onto diamond substrate 26, to within 2–3 cm thereof, to deposit carbon on the substrate. If the conditions are appropriate and the substrate is a single crystal diamond, the growth of a single crystal diamond will be propagated.

The diamond substrate and the diamond formed on the substrate can be removed from the metal heat sink by cutting the diamond from the metal heat sink, as by means of a metal saw. Any remaining metal on the diamond can be removed by dissolving the metal in an acid or a mixture thereof, such as aqua regia, which is a mixture of three volumes of hydrochloric acid to one volume of nitric acid.

The invention having been generally described, the following examples are given as particular embodiments of the invention to demonstrate the practice and advantages thereof. It is understood that the examples are given by way of illustration and are not intended to limit in any manner the specification or the claims that follow.

EXAMPLE 1

This example demonstrates preparation of the article of this invention composed of a diamond substrate brazed to a molybdenum heat sink by means of a solid brazing composition consisting of tantalum carbide and palladium having tantalum dissolved therein and particles of tantalum carbide dispersed therein.

The article was prepared by placing palladium foil (m.pt. 1554° C.) on top of a threaded molybdenum rod (m.pt.2617° C.). The palladium foil was 0.2 of an inch by 0.2 of an inch in area with a thickness of 0.004 of an inch. The molybdenum rod, which served as a heat sink, was ½ of an inch long and ⅜ of an inch in diameter. The rod and foil were placed into an alumina coated evaporation basket made from molybdenum wire connected to a rheostat and the basket was placed in a vacuum system evacuated to about $10^{-5}$ Torr. The basket had internal dimensions approximately corresponding to the heat sink. Palladium foil on top of the molybdenum rod heat sink was melted by resistively heating the evaporation basket and then the molybdenum rod to about the melting point of palladium of about 1554° C. The rod and palladium were then allowed to cool to about 100° C. by turning off the rheostat before venting the vacuum system to the atmosphere.

A thin coating of 325 mesh tantalum powder was spread uniformly over the entire surface of the solid palladium attached to the top of the molybdenum rod. The amount of tantalum powder spread on the palladium foil was about 10%, based on atomic percent basis. Then, a single crystal diamond substrate, 5 mm by 5 mm and being 0.1 mm thick, was placed on the tantalum powder and the system was again evacuated to about $10^{-5}$ Torr and heated until palladium melted again. As soon as palladium melted, brazing of the diamond substrate to the heat sink was achieved and power to the evaporation basket was turned off immediately. The time period from initial heating to the melting of palladium was 2 minutes and 20 seconds.

The article of this invention was cooled to about 100° C. before the vacuum system was vented and the article removed. The braze securing the diamond substrate to the molybdenum heat sink remained solid to about 1554° C., i.e., the melting point of palladium, which is the lowest melting portion in the article.

EXAMPLE 2

This experiment demonstrates brazing of a diamond substrate to a molybdenum heat sink by means of the Nichrome® alloy which consists of 80% nickel and 20% chromium, on weight basis.

The article was prepared by placing a Nichrome alloy foil (m. pt. 1400° C.) on top of a threaded molybdenum rod (m. pt. 2617° C.) and the diamond substrate on top of the Nichrome alloy foil. The Nichrome alloy foil was 6 mm by 6 mm in area with a thickness of 0.1 mm. The molybdenum rod heat sink was ½" long and ⅜" in diameter. The diamond substrate was single crystal measuring 5 mm by 5 mm in area and being 0.1 mm thick.

The rod, foil and the substrate were placed into an alumina coated evaporation basket connected to a rheostat and the basket was placed in a vacuum system evacuated to about $10_{-5}$ Torr. The Nichrome alloy foil on top of the molybdenum heat sink was melted by resistively heating the evaporation basket and then the molybdenum heat sink to about 1400° C. The heating period was about 5 minutes.

As soon as the alloy melted, the power to the evaporation basked was cut off immediately and the vacuum system was vented to the atmosphere when the article in the vacuum system cooled to about 100° C. The braze of the diamond substrate to the molybdenum heat sink by the Nichrome alloy was solid to about 1400° C., the melting point of the Nichrome alloy.

Many modifications and variations of the present invention are possible in light of the above teachings. It is, therefore, to be understood that within the scope of the appended claims, the invention may be practiced otherwise than as specifically described herein.

What is claimed is:

1. A unitary article that is solid at a temperature of at least 1100° C. comprising
    (a) a diamond substrate for the growth of diamond thereon,
    (b) a metal heat sink made from a metal selected from the croup consisting of molybdenum, tungsten, titanium, chromium and niobium, and
    (c) a material securing said diamond to said heat sink, said material comprising a first component contacting and bound to said diamond on one side, said first component being selected from the group consisting of metal carbides and mixtures thereof, and a second component contacting and bound to said first component on one side and to said heat sink on other side, said second component being selected from the group consisting of platinum family metals, alloys of said platinum family metals, nickel, alloys of nickel, and mixtures thereof.

2. The article of claim 1 wherein said second component contains particles of said first component.

3. The article of claim 1 wherein said first component is in the form of a layer adjacent and adhering to said diamond and said second component is in the form of a layer, distinct from said first component, adjacent and adhering to said heat sink on one side and to said first component on the other side.

4. The article of claim 3 wherein particles of said first component are dispersed in said second component.

5. The article of claim 3 wherein said heat sink is selected from the group consisting of molybdenum, tungsten, and mixtures thereof; said first component is selected from the group consisting of tantalum carbide, titanium carbide, chromium carbide, and mixtures thereof; and second component is selected from the group consisting of platinum, alloys of platinum, palladium, alloys of palladium, iridium, alloys of iridium, nickel, alloys of nickel, and mixtures thereof.

6. The article of claim 5 wherein said heat sink is molybdenum;
    said first component is chromium carbide; and said second component is selected from the group consisting of nickel, nickel-chromium alloys, and mixtures thereof.

7. The article of claim 6 wherein said nickel-chromium alloy consists essentially of about 80% nickel and about 20% chromium, on an atomic percent basis.

8. The article of claim 3 wherein said heat sink comprises molybdenum; said first component is selected from the group consisting of tantalum carbide, titanium carbide, and mixtures thereof; and said second component is selected from the group consisting of platinum, alloys of platinum and gold, palladium, and mixtures thereof.

9. The article of claim 8 wherein said diamond is about 0.001–20 mm in thickness and about 0.03–30 mm² in upper surface area; and wherein said heat sink is 0.1–13 centimeters thick, and its upper surface area is in the range of about 1–100 cm².

10. The article of claim 8 wherein said diamond is about 0.01–10 mm thick and about 0.15–15 mm² in upper surface area; and wherein said heat sink has thermal conductivity of about 0.1 to 4 watts/cm-K, is about 0.2–5 centimeters thick, and its upper surface area is about 2–40 cm².

11. The article of claim 10 wherein said heat sink comprises molybdenum, said first component is tantalum carbide, and said second component is palladium.

12. The article of claim 10 wherein the thickness of said first component and said second component is in the range of about 1–1000 microns.

13. The article of claim 1 wherein said diamond is a single crystal diamond.

14. A unitary article that is solid at a temperature of at least 1100° C. consisting essentially of
    (a) a diamond substrate for the growth of diamond thereon,
    (b) a metal heat sink, and
    (c) a material securing said diamond to said heat sink, said material comprising a first component bound to said diamond on one side, said first component being selected from the group consisting of metal carbides and mixtures thereof, and a second component contacting and bound to said first component on one side and to said heat sink on other side, said second component being selected from the group consisting of platinum family metals, alloys of said platinum family metals, nickel, alloys of nickel, and mixtures thereof.

15. The article of claim 14 wherein said heat sink is selected from the group consisting of molybdenum, tungsten, and mixtures thereof; said first component is selected from the group consisting of tantalum carbide, titanium carbide, chromium carbide, and mixtures thereof; and said second component is selected from the group consisting of platinum, alloys of platinum, nickel, alloys of nickel, and mixtures thereof.

16. The article 14 wherein said heat sink comprises molybdenum; said first component is selected from the group consisting of tantalum carbide, titanium carbide, and mixtures thereof; and said second component is selected from the group consisting of platinum, alloys of platinum and gold, palladium, and mixtures thereof.

* * * * *